United States Patent [19]

Heming et al.

[11] Patent Number: 5,295,220
[45] Date of Patent: Mar. 15, 1994

[54] PROCESS FOR THE PRODUCTION OF A THIN FILM OPTICAL WAVEGUIDE OF $TiO_2$

[75] Inventors: Martin Heming, Saulheim; Roland Hochhaus, Mainz; Jürgen Otto, Mainz; Volker Paquet, Mainz, all of Fed. Rep. of Germany

[73] Assignee: Schott Glaswerke, Mainz, Fed. Rep. of Germany

[21] Appl. No.: 975,356

[22] Filed: Nov. 16, 1992

[30] Foreign Application Priority Data

Nov. 15, 1991 [DE] Fed. Rep. of Germany ....... 4137606

[51] Int. Cl.$^5$ ............................ G02B 6/00; B05D 3/06
[52] U.S. Cl. ..................................... 385/142; 427/576; 427/575; 427/569; 427/534; 427/535; 427/539; 427/166; 427/165; 427/309
[58] Field of Search ............... 427/575, 576, 569, 166, 427/165, 309, 534, 539; 65/3.12; 385/142

[56] References Cited

U.S. PATENT DOCUMENTS

| | | | |
|---|---|---|---|
| 3,114,652 | 12/1963 | Schetky | 117/93.1 |
| 4,492,620 | 1/1985 | Matsuo et al. | 204/192 R |
| 4,873,118 | 10/1989 | Elias et al. | 427/539 |
| 5,011,705 | 4/1991 | Tanaka | 427/534 |
| 5,017,404 | 5/1991 | Paquet et al. | 427/166 |
| 5,030,574 | 7/1991 | Vary et al. | 435/252.31 |
| 5,154,943 | 10/1992 | Etzkorn et al. | 427/569 |
| 5,170,291 | 12/1992 | Szezyrbowski et al. | 427/166 |

FOREIGN PATENT DOCUMENTS

| | | |
|---|---|---|
| 2199157 | 6/1988 | Canada . |
| 2208656 | 4/1989 | Canada . |
| 0207767 | 1/1987 | European Pat. Off. . |
| 59-24807 | 2/1984 | Japan . |
| 3-018803 | 1/1991 | Japan . |
| 3-28832 | 2/1991 | Japan . |
| 90/02964 | 3/1990 | PCT Int'l Appl. . |

OTHER PUBLICATIONS

Muranova et al., Sov. J. Opt. Technol., 54(1), pp. 22–24 (Jan. 1987).

Hutcheson, *Integrated Optical Cirucits and Components*, pp. 57–69 (1987).

*Primary Examiner*—Roy King
*Attorney, Agent, or Firm*—Millen, White, Zelano & Branigan

[57] ABSTRACT

A process is disclosed for the production of an optical thin film waveguide of $TiO_2$ with an attenuation of <5 dB/cm on a planar inorganic substrate wherein the thin film waveguide is produced by a microwave plasma CVD process (PCVD).

15 Claims, No Drawings

PROCESS FOR THE PRODUCTION OF A THIN FILM OPTICAL WAVEGUIDE OF TIO₂

BACKGROUND OF THE INVENTION

The invention relates to a process for the production of a thin film optical waveguide of $TiO_2$ with an attenuation of <5 dB/cm on a planar inorganic substrate.

Thin film waveguides on planar inorganic substrates are known per se. Thus, a method for producing the waveguides by sputtering is disclosed in *Sov. J. Opt. Technol.* 54(1), Jan. 1987, pages 22-24. However, the waveguides described therein exhibit a very high attenuation absorption loss of up to 8 dB/cm, which is unsatisfactory under practical conditions. A similar process has been described in JP-OS 3-28832 of Feb. 7, 1991. Processes for the production of waveguides, ranging from thin film vapor deposition methods via sputtering, dipping and centrifugal processes to CVD, diffusion, ion exchange, or ion implantation methods, are described in L. D. Hutcheson, *Integrated Opt. Circuits and Components*, M. Dekker, Inc., New York, 1987, pages 57-69.

Although $TiO_2$ would be well suited as a material for thin film waveguides due to its physical and chemical properties—it has a very high refractive index, good chemical stability, and is very hard—no process for the production of a low-loss $TiO_2$ thin film waveguide is known from the literature. The apparent reason for this is that $TiO_2$ has a very strong tendency toward crystallization during its manufacture. Since scattering occurs on crystalline surfaces, evoking a strong absorption loss, the resultant product would suffer.

SUMMARY OF THE INVENTION

One object of this invention is to provide a process for the production of a thin film optical waveguide of $TiO_2$ on a planar inorganic substrate so that these waveguides exhibit an attenuation of <5 dB/cm.

Another object is to provide such waveguides.

Upon further study of the specification and appended claims, further objects and advantages of this invention will become apparent to those skilled in the art.

DETAILED DESCRIPTION

To attain these objects, there is provided a process for the production of an thin film optical waveguide of $TiO_2$ with an attenuation of <5 dB/cm on a planar inorganic substrate, comprising producing the thin film waveguide by a microwave plasma CVD process (PCVD).

The microwave plasma CVD process, as well as the microwave plasma impulse CVD process per se, are well-known in the art and described, for example, in U.S. Pat. Nos. 3,0114,652; 4,492,620; and 5,030,475.

The microwaves are generated in a conventional microwave generator with a frequency of 300 MHz to 10 GHz. Preferably, frequencies of between 2-3 GHz are employed because economical generators in this range are readily available. The outputs for the microwave plasma generally range between 800 W and about 10 KW. The waveguides are produced with a layer thickness of generally 0.1-0.3 μm. Layers of a particularly high quality can be obtained by using a microwave plasma impulse CVD process (PICVD). In this process, the microwaves are generated at clocked intervals. The pulse duration for the microwave pulses ordinarily ranges between 0.5-2 ms, while the intervals between pulses is customarily between 10-100 ms. With the use of the impulse process, the pulse output can be increased in correspondence with the clock ratio. However, the maximum output is restricted by the electrical specifications of the magnetron. In general, a tenfold value of the average output of the continuous wave power (CW power) will not be exceeded.

Suitable starting materials for the $TiO_2$ layer are all Ti compounds showing adequate volatility, i.e., which can be converted to the vapor phase under the operating conditions of the coating step, for example, titanium halides, such as $TiCl_4$, as well as organotitanium compounds, such as titanium esters or titanium acetylacetonate. A reactant gas is also employed which can split off oxygen ions to convert the titanium compound into $TiO_2$. Such gases are, for example, $H_2O$, $CO_2$, $N_2O$, $NO_2$, etc. Furthermore, instead of a pure $TiO_2$ layer, it may sometimes be advantageous (for example, to suppress crystallization) to produce a layer containing minor amounts of further oxides, for example, ZnO, $Nd_2O_5$, $Ta_2O_5$, $ZrO_2$, $HfO_2$ or $SiO_2$. These various oxides, however, are generally contained in the $TiO_2$ layer only in quantities of, in total, up to 5%. The starting compounds for these further oxides can be organic or inorganic compounds of these elements, e.g., $NdCl_5$, $SiCl_4$, $(CH_3)_3$—Si—O—Si—$(CH_3)_3$ (hexamethyldisiloxane); dimethyl- or diethyl-zinc; pentaethoxytantanlum; and for zirconium and hafnium, the tertiary alkoxides, e.g., the butoxides. It is preferable, however, not to use these oxides because they lower the index of refraction. In some cases though, the addition of oxides will be necessary, depending on the end use temperature of the waveguide, in order to avoid the formation of $TiO_2$ crystals. The optimum amount, if any, will be dependent on the specific end use.

Plates of glass, as well as monocrystals, e.g., sapphire, are primarily utilized as the inorganic substrates. A very safe glass is quartz. Any type of glass can be used, but it is preferred to use glasses having a low alkali content because, under some circumstances, alkali ions can migrate into the light-conducting layers which, in turn, could deleteriously affect the adhesiveness of the layer, for example. Of course, an alkali-free intermediate layer between the substrate and the light-conducting layer can be used, as well.

The $TiO_2$ layers produced with the microwave plasma CVD process have an attenuation of <5 dB/cm (for TE01 mode). The substrate temperature during the coating step ranges between about 40°-300° C. wherein a temperature starting with 60° C. is preferred since the thus-produced $TiO_2$ layers then exhibit a lower attenuation. Substrate temperatures as low as 60° C. are adequate for producing waveguiding $TiO_2$ layers having an attenuation of <3 dB/cm. These layers moreover show a high packing density of almost 1 (=100% of theoretical density) and do not exhibit a columnar structure; they are completely oxidized throughout and have a refractive index corresponding practically to that of pure solid $TiO_2$.

Without being bound by an explanation of the mechanism of the invention, it is believed that the special quality of the $TiO_2$ waveguide layers produced according to the microwave plasma CVD method is based on the fact that, in the parameter field of the coating, the electron temperature amounts to only a few eV and that the self-bias potential between plasma and substrate is, with <20 volt, relatively low. The surface of the substrate thus does not suffer any radiation damage by the plasma. The original surface properties of the substrate, as well as the properties of the thus-formed layer, are not impaired thereby.

It is furthermore advantageous to bring the substrate, prior to coating, in contact with an oxygen-containing microwave plasma which does not contain any coating materials. The substrate is thus cleaned merely on the surface by the activated oxygen.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever.

In the foregoing and in the following example, all temperatures are set forth uncorrected in degrees Celsius; and, unless otherwise indicated, all parts and percentages are by weight.

The entire disclosure of all applications, patents and publications, cited herein and of corresponding German Application P 41 37 606, filed Nov. 15, 1991, are hereby incorporated by reference.

EXAMPLE

Production of a waveguide of $TiO_2$ on a quartz glass plate. The coating step is performed in a conventional microwave plasma impulse CVD facility as described, for example, in J. Otto et al., SPIE (Society of Photooptical Instrumentation Engineers), Vol. 1323, 1990, pages 39–49, published by the International Society for Optical Engineering, P.O. Box 10, Bellingham, Wash. 98227-0010, U.S.A. This facility includes a parallel-plate reactor with gas sparger. The reaction gases are conducted through the gas sparger into the reaction chamber. The substrate is disposed on a dielectric base plate transparent to microwaves. The process waste gases are radially exhausted by pumping. The frequency of the microwave generator amounts to 2.45 GHz. First of all, the substrate was freed of impurities on the substrate surface by a plasma pretreatment. For this purpose, oxygen was introduced under a pressure of 0.8 mbar in an amount of 100 ml/min into the reaction chamber. In place of oxygen, it is also possible to use nitrogen, argon, or mixtures of the three gases. The plasma was generated by means of a microwave generator with a frequency of 2.45 GHz. The plasma was generated in a timed sequence; the pulse for the burning period of the plasma was 1 ms while the pulse interval during which the plasma was cut off amounted to 90 ms. The plasma pretreatment was finished after 5–300 seconds, depending on the extent of contamination of the substrate surface and the thickness of the water skin bound by adsorption to the surface. Thereafter, coating with $TiO_2$ took place under the following conditions:

Pressure: 0.8 mbar
Mass flow $TiCl_4$: 4 ml/min
Mass flow $O_2$: 100 ml/min
Pulse duration: 1 ms
Pulse interval: 90 ms
Substrate temperature: 60° C.

Under these conditions, a coating rate was obtained of 40 nm/min. After a layer thickness of 140 nm had been attained, the experiment was terminated. Instead of a substrate temperature of 60° C., it is possible to utilize substrate temperatures of up to 300° C. Especially satisfactory layers result in this range. Waveguide paths of any desired optical geometry can be formed in the surface of the substrate by means of conventional etching methods, e.g., by ion beam etching. The losses in the waveguide for TE01 waves range at 2.5 dB/cm.

The preceding example can be repeated with similar success by substituting the generically or specifically described reactants and/or operating conditions of this invention for those used in the preceding example.

From the foregoing description, one skilled in the art can easily ascertain the essential characteristics of this invention and, without departing from the spirit and scope thereof, can make various changes and modifications of the invention to adapt it to various usages and conditions.

We claim:

1. A process for the production of an optical waveguide comprising a planar inorganic substrate coated with a $TiO_2$ film, said process comprising coating said planar inorganic substrate with said $TiO_2$ film by a microwave plasma CVD process (PCVD), wherein the resultant optical waveguide exhibits an attenuation of $<5$ dB/cm.

2. A process according to claim 1, wherein said $TiO_2$ film is produced by means of a microwave plasma impulse CVD process (PICVD).

3. A process according to claim 1, wherein microwaves are utilized at a frequency range of 0.3–10 GHz.

4. A process according to claim 1, wherein the surface of said inorganic substrate is cleaned, prior to being coated with said $TiO_2$ film, by a treatment with an $O_2$-containing microwave plasma.

5. A process according to claim 2, wherein microwaves are utilized at a frequency range of 0.3–10 GHz.

6. A process according to claim 2, wherein the surface of said inorganic substrate is cleaned, prior to being coated with said $TiO_2$ film, by a treatment with an $O_2$-containing microwave plasma.

7. A process according to claim 6, wherein microwaves are utilized at a frequency range of 0.3–10 GHz.

8. A process according to claim 1, further comprising heating said substrate during the coating step to a temperature of 60°–300° C.

9. A process according to claim 1, wherein the resultant optical waveguide exhibits an attenuation of less than 3 dB/cm.

10. A process according to claim 1, wherein said $TiO_2$ film has a thickness of 0.1–0.3 $\mu$m.

11. A process according to claim 2, wherein the pulse duration of the microwave pulses is 0.5–2 ms and the intervals between microwave pulses is 10–100 ms.

12. A process according to claim 1, wherein the source of Ti utilized in the microwave plasma CVD process is a titanium halide or an organotitanium compound.

13. A process according to claim 1, wherein said $TiO_2$ film contains up to 5% of at least one other metal oxide selected from the group consisting of ZnO, $Nd_2O_5$, $Ta_2O_5$, $ZrO_2$, $HfO_2$ and $SiO_2$.

14. An optical waveguide comprising a planar inorganic substrate coated with a $TiO_2$ film having a thickness of 0.1–0.3 $\mu$m, wherein said optical waveguide exhibits an attenuation of less than 5 dB/cm.

15. An waveguide according to claim 14, wherein said waveguide exhibits an attenuation of less than 3 dB/cm.

* * * * *